US007359278B2

(12) United States Patent
Fischer

(10) Patent No.: US 7,359,278 B2
(45) Date of Patent: Apr. 15, 2008

(54) METHOD FOR PRODUCING AN INTEGRATED MEMORY MODULE

(75) Inventor: Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 479 days.

(21) Appl. No.: 11/009,557

(22) Filed: Dec. 10, 2004

(65) Prior Publication Data

US 2005/0141336 A1 Jun. 30, 2005

(30) Foreign Application Priority Data

Dec. 11, 2003 (DE) ............................... 103 57 862

(51) Int. Cl.
*G11C 8/00* (2006.01)
(52) U.S. Cl. ............... 365/230.06; 365/233; 365/233.5
(58) Field of Classification Search ........... 365/230.06, 365/233, 233.5
See application file for complete search history.

(56) References Cited

U.S. PATENT DOCUMENTS 6,385,691 B2   5/2002   Mullarkey et al.

6,459,635 B1 * 10/2002 Mullarkey et al. .......... 365/201
6,590,824 B2 *  7/2003 Benedix et al. ............. 365/222

FOREIGN PATENT DOCUMENTS

DE 195 24 874 C1 3/1997

OTHER PUBLICATIONS

German Patent Office Examination Report dated Sep. 22, 2004.

* cited by examiner

*Primary Examiner*—Pho M. Luu
(74) *Attorney, Agent, or Firm*—Patterson & Sheridan, L.L.P.

(57) ABSTRACT

A method for producing an integrated memory module containing a command decoding device that responds to external operation commands to set operating states of the memory module for carrying out operations in accordance with a predetermined specification of the memory module. The command decoding device is formed with a decision memory containing memory locations $M_{i,j}$, the storage capacity of which suffices to receive, for an arbitrary specification from a plurality of different specifications, a decision information item specifying whether or how the second operation command of selected pairs of two directly successive operation commands is to be executed. After integration of the command decoding device thus formed, the decision information items demanded in the case of the predetermined specification are written to the memory locations of the decision memory.

20 Claims, 2 Drawing Sheets

METHOD FOR PRODUCING AN INTEGRATED MEMORY MODULE

CROSS-REFERENCE TO RELATED APPLICATIONS

This application claims foreign priority benefits under 35 U.S.C. §119 to co-pending German patent application number DE 103 57 862.5, filed 11 Dec. 2003. This related patent application is herein incorporated by reference in its entirety.

BACKGROUND OF THE INVENTION

1. Field of the Invention

The invention relates to a method for producing an integrated memory module having a command decoding device. A preferred, but not exclusive, area of application of the invention is the production of dynamic random access memory (DRAM) modules (i.e., dynamic read-write memories with random direct access).

2. Description of the Related Art

As is known, the production of memory circuits on semiconductor chips requires a multiplicity of processes in order to integrate the circuit elements and the connections thereof on a substrate. The integration is usually effected lithographically in a plurality of layers or planes, in each case using exposure masks that define the spatial pattern of the semiconductor and metal structures to be formed in the individual planes. For mass production, a plurality of memory circuits of identical type (usually a few hundred) are formed on a common substrate wafer, which is subsequently cut up to obtain the individual memory circuits as small chips. Each chip is then mounted on a housing base and wired with the external terminal pins fitted thereon. After subsequent encapsulation in the housing, the module thus formed can be supplied to the customer.

Between the conclusion of the integration steps on the wafer and delivery to customers, the individual memory circuits are subjected to manifold tests to check for defects and to repair, where possible, defects that have been identified. Such repairs are usually effected by making or breaking conductive connections with the aid of integrated fusible links (so-called "fuses") in order to replace defective elements by defect-free elements that are present in redundant fashion.

The totality of the above mentioned production and test procedures, from the beginning of the lithographic processes to the completion of chips that can be delivered, requires a relatively long time. The total fabrication time currently amounts to approximately four to six months.

Besides the multiplicity of data memory cells, a memory module contains diverse further devices to control access to the memory cells depending on external command and address information items and to transfer the data that are to be written or have been read between the memory cells and external data terminals. During operation, the memory module usually communicates with a controller that supplies the command and address information items and also the write data and receives the data read. The commands are applied to the module at a command input usually in the form of a code word comprising a plurality of parallel bits, which is decoded by a command decoding device in the module in order to set operating states of the memory module for carrying out the operations commanded.

The specifications that determine the behavior of a memory module also include the command specification, i.e., the specification regarding the execution of the commands. The main constituent of this execution specification is the assignment of the different possible bit patterns of the command code word to the operating states that are respectively to be set or to the operations to be carried out (i.e., the decoding specification or truth table of the command decoding device). Furthermore, the command specification must, however, also define how the memory module is to react to prohibited (i.e., "illegal") sequences of commands. This is because there are critical commands whose execution is not permitted to be terminated at any time by an arbitrary successor command. For this purpose, it is known, after reception of such a critical command or from the beginning of the commanded operation, to start a timer that causes the command decoding device to ignore any successor command for a certain duration. On the other hand, there are commands after whose execution some successor commands are allowed and some successor commands are illegal. The memory modules that are commercially available at the present time rely on the controller to not send any command sequence in which appears a command that would be an illegal successor of the preceding command.

However, some customers would like to permit illegal command sequences on the memory modules that they use, but they wish the module to show predictable, i.e., specific expected reactions, if the present command is an illegal successor of the predecessor command. The scope of possible illegal sequences is not necessarily of unlimited magnitude. Rather, there may be a clear and predictable number of command pairs in which the later command is illegal with respect to the earlier command.

The respectively desired command specification which in each case defines the behavior of the memory module and also in the case of the diverse illegal sequences may differ from customer to customer, and the demand for different specifications may also change rapidly. For a memory chip manufacturer, it is important to be able to react as quickly as possible to any demand. This is obstructed by the fact that the fabrication time of the memory chips is relatively long, as mentioned above.

U.S. Pat. No. 6,385,691 B2 discloses an integrated memory module having a memory for receiving successive operation commands, a switching part controlling at least the power supply of parts of the memory in a manner dependent on at least the next operation command. DE 195 24 874 C1 discloses a memory module that is put into a particular operating mode only when specific operation commands are input in the correct order.

SUMMARY OF THE INVENTION

One aspect of the invention is to specify a technique that allows the manufacturer of memory modules to react more quickly to different customer desires with regard to command specification.

Accordingly, one embodiment of the invention relates to a method for producing an integrated memory module containing a command decoding device that responds to external operation commands in order to set operating states of the memory module for carrying out operations in accordance with a predetermined specification of the memory module. According to one embodiment of the invention, the command decoding device is formed by integration of at least the following components:

a decision memory, which contains in each case an assigned memory location for each of a selected set of pairs of two directly successive operation commands that can be applied given an arbitrary specification from m different specifications of the memory module, the storage capacity of which memory location suffices to receive, for an arbitrary one of the m specifications, a decision information item specifying whether or how the second operation command of the relevant pair is to be executed;

a holding device for buffer-storing each received external operation command until reception of the succeeding operation command;

an addressing device, which, upon reception of the successor command, addresses that memory location which is assigned to the pair of this command and the buffer-stored predecessor command; and a processor device, which sets the operating states of the memory module in accordance with the decision information item contained in the addressed memory location.

After integration of these components, the decision information items demanded in the case of the predetermined specification are written to the memory locations of the decision memory.

The method according to one embodiment of the invention affords, after conclusion of the lithographic integration processes that make up a large part of the long fabrication time, an intermediate product in which the command decoding device may be adapted to an arbitrary specification from m different specifications with regard to the processing of command sequences. The adaptation of the memory module to a desired specification can thus be effected at a relatively late stage of production by corresponding programming of the integrated decision memory, e.g., by subsequent metallization in an upper metallization plane or by fuse technology. As a result, the manufacturer is able to react quickly to customer desires.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
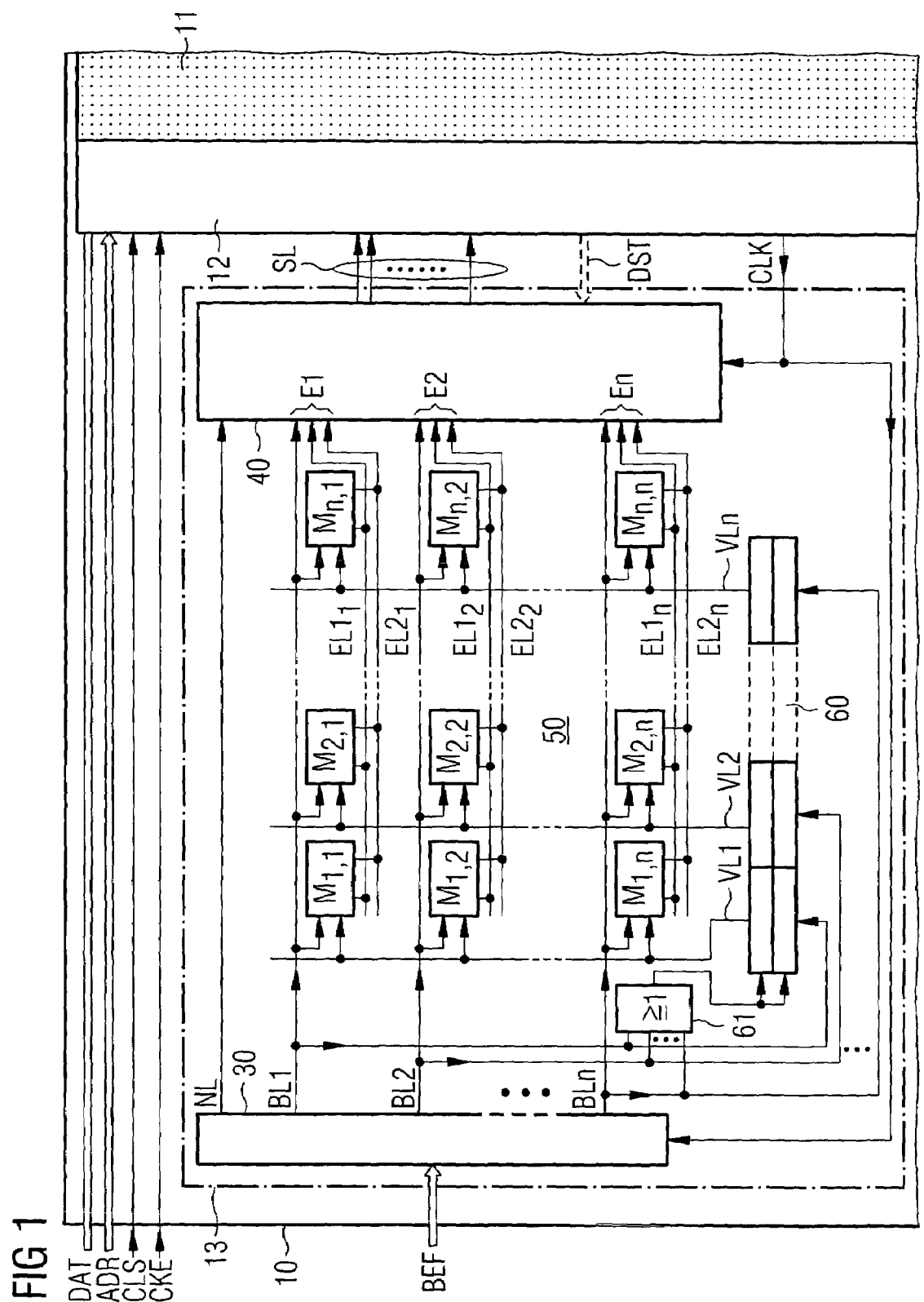
FIG. 1 is a schematic diagram showing the construction of a memory module produced by the method according to one embodiment of the invention.

In the figures, elements of identical type are designated by the same reference numerals or letter combinations, which in some cases are suffixed by a numeral or a lower case letter as a sequential indicator. In the case where a plurality of elements of identical type are denoted inclusively, the relevant numbers are placed in square brackets [ ], with a colon ":" representing the word "to".

The memory module 10 (also referred to herein as DRAM 10) illustrated schematically in FIG. 1 is a "synchronous" dynamic random access memory (SDRAM) whose constituent parts are all integrated on a chip, as indicated by the bold rectangular contour line. The set of data memory cells, which may be distributed between a plurality of banks, each bank having a plurality of segments, is illustrated schematically by the shaded block 11. An internal control device 12 and a command decoding device 13 (broken contour line) are illustrated as further blocks on the chip.

Situated on the chip of the DRAM 10 are a plurality of external terminals, of which the following are shown: a data terminal DAT for inputting and outputting memory data bits in parallel form; an address terminal ADR for applying address bits in parallel form; a command terminal for applying a command code word comprising parallel command bits BEF; a terminal for applying a system clock signal CLS; and a terminal for applying the clock activation signal CKE. All these terminals may be connected via external lines to corresponding terminals of a controller (e.g., memory chip controller MCC), which is not illustrated in FIG. 1.

The data memory cells, which are arranged in matrix form in rows and columns in customary DRAMs, are selectively accessed by activation of a word line assigned to the selected column and connection of sense amplifiers assigned to the selected columns to the data terminals. Before each new word line activation, it is necessary to precharge the bit lines between the data memory cells and the sense amplifiers to a specific potential (so-called precharge).

The control device 12 controls the operations of the DRAM 10 depending on operation commands derived from the command bits BEF of the controller. For this purpose, the command bits BEF are decoded in the command decoding device 13, in such a way that, for each operation command to be executed, a specific combination of enable lines SL is excited to condition specific elements in the control device 12 for the execution of the relevant command. Thus, by way of example, the operation command "activation" (ACT), if it is to be executed, leads to the excitation of those enable lines SL which condition the elements, inter alia, for retrieving the row address at an address buffer, for canceling the precharge of the bit lines and for switching the word lines of the addressed row to H (High) potential. A subsequent operation command "reading" excites those enable lines SL which condition the elements for maintaining H potential on the word line, for retrieving the column address and for connecting the sense amplifiers selected in accordance with the column address to the data terminals DAT. The individual steps within such (and other) commanded operations are time-controlled by an internal clock signal CLK which is switched on and is synchronized with the system clock signal CLS as long as the signal CKE from the controller has the logic value "1".

The command decoding device 13 carries out the decoding of the commands sent by the controller in two stages. In accordance with the illustration in FIG. 1, a command predecoder 30 receives the command bits BEF and, for each of n different operation commands, brings precisely one assigned exemplar line of n command lines BL1 to BLn temporarily into an activated state, to be precise for a segment of a period of the clock signal CLK. Each operation command "x" is thus indicated by excitation of the assigned command line BLx (where x=1, 2, . . . n). Each of these lines leads to an assigned input of a processing device 40, which forms the output stage (output decoder) of the command decoding device 13 and can excite the enable lines SL in the desired pattern for execution of a command.

Apart from the n different operation commands that are decoded in the predecoder 30 by activation of a respective assigned exemplar line of the n command lines BL[1:n], the command code word comprising the command bits BEF may also comprise other command information items that state that no change is to be made to the instantaneous setting of the enable lines SL. Such "no operation commands" are sent by the controller during the times between the operation commands (so-called NOP command), or during the times in which the memory module 10 is "deselected", i.e., not selected for a write or read mode operation (so-called DESL command). The predecoder 30 is designed such that it activates a "no command line" upon reception of a no operation command.

During the production of the memory module 10, the command decoding device 13 is provided, according to one embodiment of the invention, with circuit means that allow the behavior of the module to be adapted to an arbitrary specification from m different specifications in the event of illegal command sequences. The circuit means may contain a holding device 60 for buffer-storing each received external operation command until reception of the succeeding operation command, a programmable decision memory 50, which, for each pair of two successive operation commands, can store a decision about the handling of the second command of said pair, and a logic that takes account of the stored decision in the processing device 40. The aforementioned circuit means are integrated together with the remaining components of the memory module on the same chip.

In the case of the exemplary embodiment according to FIG. 1, the decision memory 50 includes a memory cell $M_{i,j}$ for every possible combination of two successive operation commands i,j. Each memory cell has enough memory space to store a decision information item regarding how the second command j (successor command) of the command pair i,j is to be handled after reception of the first command i (predecessor command). The required minimum capacity of each memory location depends on how many decision possibilities are to be permitted in the case of the relevant command pair in order to take account of all m specifications of this pair. The number of decision possibilities to be permitted may differ from command pair to command pair. For the sake of simplicity, a description shall be given of the case in which this number is equal to four for all of the command pairs, so that two binary memory elements in each memory location suffice. The two-bit decision information item could supply, e.g., one of the following decisions:

00 Execute successor command j immediately;
01 Buffer successor command j and execute it only when the execution of the predecessor command i has ended;
10 Terminate execution of the predecessor command i in a noncritical phase of the commanded operation and then execute the successor command j; and
11 Interpret successor command j as NOP and completely ignore it.

Following is an example: the operation command No. 1 which activates the command line BL1, shall be the command READA="Read and subsequent automatic precharge", and the command No. 2 which activates the command line BL2, shall be the command WRITEA="write and subsequent automatic precharge". For cases in which such commands directly succeed one another (that is to say in the case of a command pair READA-READA, READA-WRITEA, WRITEA-READA or WRITEA-WRITEA), one of the specifications might stipulate completely ignoring the second command (i.e., interpreting the second command as a no operation command NOP), and another specification might stipulate interrupting the current write or read burst and executing the second command. In other words, for adaptation to the first specification, the information "11" would be programmed into the decision memory cells $M_{1,1}$, $M_{1,2}$, $M_{2,1}$, $M_{2,2}$, and for adaptation to the second specification, the information "10" would be programmed into said cells.

During operation of the memory module, upon reception of a command j succeeding a command i, the decision information item for the successor command j is retrieved from the assigned decision memory cell $M_{i,j}$ and fed to the processing device 40 to cause this device to handle the successor command j in accordance with the retrieved decision. For this purpose, upon reception of a command j, a circuit arrangement is provided to address the decision memory cells M depending on i and j, which may comprise the above-mentioned holding device for buffer-storing the operation commands.

In the case of the exemplary embodiment illustrated, the holding device may comprise a two-stage shift register 60 for n parallel bits, the n signal inputs of which are connected to the n command lines BL[1:n]. It is assumed that the active state of the command lines BL[1:n] is the "high" logic potential H, which corresponds to the logic value "1", and that the inactive state of said lines is the "low" logic potential L, which corresponds to the logic value "0". The shift register receives its shift pulses from an OR gate 61 having n inputs connected to the n command lines BL[1:n].

After initialization of the memory module, all operation command lines BL[1:n] are initially at logic value "0". As soon as the predecoder 30 decodes any operation command i (where i=1, 2, 3, . . . n), the relevant command line BLi goes to logic value "1" for the duration of a CLK clock pulse, while the other command lines remain at logic value "0". Still within the same clock pulse, a shift pulse for the register 60 appears via the OR gate 61, with the result that the logic value "1" of the activated command line BLi is loaded into the corresponding bit position of the first register stage. The logic value "0" bits previously present in all bit positions of the first stage are shifted into the second stage. A respective logic value "0" is loaded into the other respective bit positions of the first register stage. In the case of a succeeding operation command j, only the relevant command line BLj (where j=1, 2, 3, . . . n) goes to logic value "1" for the duration of a CLK clock pulse, and the OR gate 61 once again supplies a logic value "1" pulse. As a result, the logic value "1" of the activated command line BLj is loaded into the corresponding bit position of the first register stage, and the previous bit pattern of the first stage is shifted into the second stage. This has the effect that a logic value "1" appears on the output line VLi, while all other output lines VL are at "0". The interplay continues in this way with each new operation command. The consequence is that whenever a successor command j appears which activates the assigned command line BLj, the line VLi assigned to the predecessor command i is activated. This combination of line activations may be utilized for the addressing of the decision memory cell $M_{i,j}$.

Figure 2:
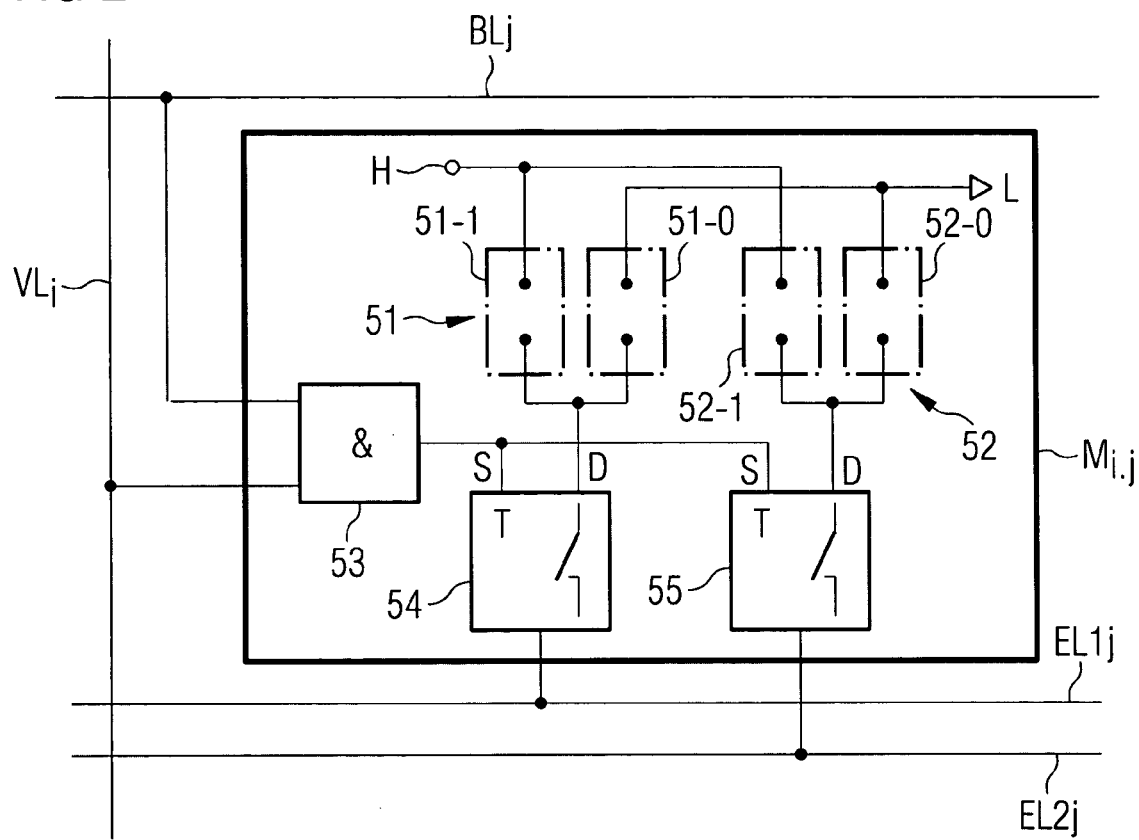
FIG. 2 shows further details of a cell of the decision memory in the command decoding device of the module according to FIG. 1.

FIG. 2 shows an example of the construction of the decision memory cells. The illustration shows a decision memory cell $M_{i,j}$ for a command pair in which an operation command i is followed by an operation command j. The cell $M_{i,j}$ has two selection inputs, one of which is connected to the command line BLj assigned to the successor command j and the second of which is connected to the output line VLi of the shift register 60 which is assigned to the predecessor command i. These two selection inputs are connected to the two inputs of an AND gate 53 in the cell $M_{i,j}$, the output of which supplies a logic value "1" precisely when BLj and VLi are simultaneously at logic value "1" (i.e., precisely when the operation command j appears after the operation command 1). The output of the AND gate 53 is connected to the control inputs S of two transmission gates (or transfer gates) 54 and 55, the data inputs D of which are connected to a respective assigned 1-bit memory element 51 and 52 and the outputs of which lead to a respective assigned decision bit line $EL1_j$ and $EL2_j$. The two transmission gates 54 and 55 are switched to the on state by the logic value "1" at the output of the AND gate 53 to transfer two decision bits from the memory elements 51 and 52 to the decision bit lines $EL1_j$ and $EL2_j$.

The two 1-bit memory elements 51 and 52 are illustrated in the unprogrammed state in FIG. 2, in each case in the form of a still "open" (i.e., nonconducting) bridge pair 51-0, 51-1 and 52-0, 52-1, respectively. On one side, the first bridge pair 51-0, 51-1 is connected to the data input D of the first transmission gate 54. The other side of the bridge 51-0 is connected to a source of the low logic potential L (logic "0") while the other side of the bridge 51-1 is connected to a source of the high logic potential H (logic "1"). Similarly, on one side, the second bridge pair 52-0, 52-1 is connected to the data input D of the second transmission gate 55. The other side of the bridge 52-0 is connected to the source of the low logic potential L while the other side of the bridge 52-1 is connected to the source of the high logic potential H.

All decision memory cells which are valid for command pairs with, in each case, the same successor command j are, in each case, assigned the same decision bit line group $EL1_j$, $EL2_j$, as shown in FIG. 1. Thus, by way of example, the cells $M_{1,2}, M_{2,2}, \ldots M_{n,2}$ which are valid for the command pairs in which the operation command No. 2 (activation of the command line BL2) appears as successor command are assigned the same decision bit lines $EL1_2$ and $EL2_2$. Each decision bit line group $EL[1:2]_j$ leads, together with the command line BLj assigned to the relevant operation command j, to an assigned multiple input Ej of the processing device 40. The processing device 40 contains a logic which, upon activation of the command line BLj, influences the excitation states of the enable lines SL in such a way that the relevant command j is handled in accordance with the bit pattern of the assigned decision lines $EL[1:2]_j$.

After the circuits of the memory module 10 that have been described up to this point have been integrated on the chip substrate, the decision memory 50 may be programmed in accordance with the respectively desired specification (i.e., the respectively desired decision information items are written to the cells $M_{1,1}$ to $M_{n,n}$). The programming may be effected by closing (i.e., making a conductive connection) one of the two bridges in the memory elements 51 and 52, respectively. If a memory element is to supply a logic value "0", then the bridge connected to the L terminal is closed; if the memory element is to supply a logic value "1", then the bridge connected to the H terminal is closed.

In the case of the example illustrated in FIG. 2, the bridges may be integrated in the memory elements 51 and 52 during the integration process as line interruptions that may be closed by lithographic metallization or by being fused together (e.g., by means of a laser). Such procedures may be effected at a late stage of the wafer/substrate processing. To make this possible, the open ends of the line interruptions may be provided in the topmost metallization plane.

As an alternative, all bridges may be integrated as closed bridges, and the programming may be performed by destroying (i.e., opening) a respective one of the two bridges in each memory element. These destructible bridges may comprise laser fuses as known in the art. The destruction of the bridges by means of laser bombardment may likewise be effected at a late stage on the wafer or even on the base-mounted chip shortly before the encapsulation thereof, if the fuses are arranged in such a way that they are accessible to a laser beam at this stage. Alternatively, instead of laser fuses, electrical fuses may be incorporated (i.e., bridges that can be destroyed by application of an overvoltage).

The design of the command decoding device 13 described with reference to FIGS. 1 and 2 is only an example that provides, in the decision memory 50, for each of the possible pairs of two successive operation commands i, j, a respective memory cell $M_{i,j}$ for e=2 decision bits for handling of the command j. If n is the number of possible operation commands, then $n^2$ decision memory cells $M_{i,j}$ are provided in the case of this exemplary embodiment. To program the decision memory, it is then necessary to manipulate $e*n^2$ bridges (closed open bridges or open closed bridges).

The outlay on circuitry and programming may be reduced by providing decision memory cells only for those command pairs i,j in which the successor command j is to be handled differently in the case of different specifications. In other words, no programmable decision memory cell is necessary for all those commands j that are to be handled identically in the case of the different specifications, irrespective of the predecessor command i which they follow. The execution of such a command is then stipulated by the processing device 40 always in the same way. If, by way of example, the command No. n (activation of the-command line BLn) is such a command, then it is possible to omit all the associated decision memory cells $M_{1,n}$ to $M_{n,n}$ and also the associated decision bit lines $EL[1:2]_n$.

Operation commands for which, as successor j of an arbitrary predecessor command i, only two handling possibilities are to be permitted, require only a 1-bit decision information item. The assigned decision memory cells then need contain only a single programmable 1-bit memory element (and a single transmission gate). By way of example, if the command No. 1 (activation of the command line BL1) is such a command, then all the decision memory cells $M_{1,1}$ to $M_{n,1}$ may be designed in a correspondingly simpler manner, and one of the two decision bit lines $EL[1:2]_2$ may be omitted.

As already indicated further above, some decision information items may specify ignoring a command (and if desired, buffering the command for a delayed execution) for as long as an operation phase that is not to be interrupted is proceeding. To indicate the existence of such a critical state to the processing device 40, the control device 12 may be provided with means for deriving a corresponding state information item DST that provides information about the respective operating state of the memory module 10.

It should also be mentioned that compensating delays may be inserted at suitable locations in the command decoding device 30 to ensure that the two selection inputs of the respectively addressed decision memory cell are activated temporally coincidently and that the retrieved decision information item appears temporally coincidently with the logic value "1" level of the activated command line at the assigned input of the processing device 40.

While the foregoing is directed to embodiments of the present invention, other and further embodiments of the invention may be devised without departing from the basic scope thereof, and the scope thereof is determined by the claims that follow.

What is claimed is:

1. A method for forming an integrated memory module, comprising:

forming a plurality of data memory cells;

forming a control device for controlling access to the plurality of memory cells; and forming a command decoding device for receiving external operation commands and selectively providing received operation commands to the control device, wherein the command decoding device is programmable to a predetermined specification from a plurality of different specifications available on the memory module, each of the plurality of different specifications setting an operating state of the memory module for carrying out the received operation commands, and wherein the command decoding device is formed to comprise a decision memory, which contains an assigned memory location ($M_{i,j}$) for each of a selected set of pairs of two directly successive operation commands that can be applied given an arbitrary specification from the plurality of different specifications for the memory module.

2. The method of claim 1, wherein the command decoding device is formed to further comprise:

a storage capacity of each memory location ($M_{i,j}$) sufficient to receive, for the arbitrary specifications, a decision information item specifying handling of a succeeding operation command of two successive operation commands, wherein the memory locations of the decision memory is programmable with the decision information items according to the predetermined specification;

a holding device for buffer-storing each received external operation command until reception of the succeeding operation command;

an addressing device, which, upon reception of the succeeding operation command, addresses that memory location which is assigned to the two successive operation commands; and a command processing device for setting the operating states of the memory module in accordance with the decision information item contained in the addressed memory location $M_{i,j}$.

3. The method of claim 2, wherein the memory locations of the decision memory are formed to comprise a plurality of binary memory elements and wherein each binary memory element is set to one of a first binary state "1" and a second binary state "0" which are determined by a connection to one of a high logic potential and a low logic potential, respectively.

4. The method of claim 3, wherein the connection is a low-impedance connection formed by metallization in an upper metallization plane of the memory module.

5. The method of claim 3, wherein the connection is a low-impedance connection formed by manipulation of a fuse element.

6. The method of claim 3, wherein the memory module is programmed by setting the binary memory elements in a late stage of production prior to packaging the memory module in a housing.

7. The method of claim 3, wherein the memory module is programmed by setting the binary memory elements after the memory module has been packaged in a housing.

8. An integrated memory module, comprising:

a plurality of data memory cells;

a control device for controlling access to the plurality of memory cells; and a command decoding device for receiving external operation commands and selectively providing received operation commands to the control device, wherein the command decoding device is programmable to a predetermined specification from a plurality of different specifications available on the memory module, each of the plurality of different specifications setting an operating state of the memory module for carrying out the received operation commands, and wherein the command decoding device comprises a decision memory, which contains an assigned memory location ($M_{i,j}$) for each of a selected set of pairs of two directly successive operation commands that can be applied given an arbitrary specification from the plurality of different specifications for the memory module.

9. The memory module of claim 8, wherein the command decoding device comprises:

a storage capacity of each memory location ($M_{i,j}$) sufficient to receive, for the arbitrary specifications, a decision information item specifying handling of a succeeding operation command of two successive operation commands, wherein the memory locations of the decision memory is programmable with the decision information items according to the predetermined specification;

a holding device for buffer-storing each received external operation command until reception of the succeeding operation command;

an addressing device, which, upon reception of the succeeding operation command, addresses that memory location which is assigned to the two successive operation commands; and a command processing device for setting the operating states of the memory module in accordance with the decision information item contained in the addressed memory location $M_{i,j}$.

10. The memory module of claim 9, wherein the memory locations of the decision memory comprise a plurality of binary memory elements.

11. The memory module of claim 10, wherein each binary memory element is set to one of a first binary state "1" and a second binary state "0" which are determined by a connection to one of a high logic potential and a low logic potential, respectively.

12. The memory module of claim 11, wherein the connection is a low-impedance connection formed by metallization in an upper metallization plane of the memory module.

13. The memory module of claim 11, wherein the connection is a low-impedance connection formed by manipulation of a fuse element.

14. The memory module of claim 11, wherein the memory module is programmed by setting the binary memory elements in a late stage of production prior to packaging the memory module in a housing.

15. The memory module of claim 11, wherein the memory module is programmed by setting the binary memory elements after the memory module has been packaged in a housing.

16. The memory module of claim 9, wherein the decision memory include decision memory cells only for command pairs in which the succeeding operation command is to be handled differently in the case of different specifications.

17. A method for producing an integrated memory module, comprising:

forming a command decoding device that responds to external operation commands to set operating states of the memory module for carrying out operations in accordance with a predetermined specification for the memory module, the command device comprising:

a decision memory, which contains an assigned memory location ($M_{i,j}$) for each of a selected set of pairs of two directly successive operation commands that can be applied given an arbitrary specification from m different specifications of the memory module, the storage capacity of which memory location suffices to receive, for the arbitrary specifications, a decision information item specifying handling of a succeeding operation command of two successive operation commands;

a holding device for buffer-storing each received external operation command until reception of the succeeding operation command;

an addressing device, which, upon reception of the succeeding operation command, addresses that memory location ($M_{i,j}$) which is assigned to the two successive operation commands and a buffer-stored predecessor command; and a processing device, which sets the operating states of the memory module in accordance with the decision information item contained in the addressed memory location ($M_{i,j}$); and programming the memory locations of the decision memory with the decision information items according to the predetermined specification.

18. The method of claim 17, wherein the memory locations $M_{i,j}$ of the decision memory are formed with binary memory elements, the binary states of which are determined by connections to one of two logic potentials.

19. The method of claim 18, wherein the connections are low-impedance connections formed by metallizations in an upper metallization plane of the memory module.

20. The method of claim 18, wherein the connections are low-impedance connections formed by manipulation of fuse elements.

* * * * *